(12) United States Patent
Cheong et al.

(10) Patent No.: US 11,888,179 B2
(45) Date of Patent: Jan. 30, 2024

(54) BATTERY CONNECTION MODULE

(71) Applicant: Molex, LLC, Lisle, IL (US)

(72) Inventors: Sheau Noan Cheong, Jurong Town (SG); Han Guan Tan, Jurong Town (SG); Yong Lin, ChengDu (CN); Yun-Jin Li, ChengDu (CN)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/352,404

(22) Filed: Jun. 21, 2021

(65) Prior Publication Data

US 2022/0006160 A1    Jan. 6, 2022

(30) Foreign Application Priority Data

Jul. 3, 2020  (CN) .......................... 202010636564.X

(51) Int. Cl.
  *H01M 50/507*  (2021.01)
  *H01M 50/519*  (2021.01)
  *H01M 50/545*  (2021.01)

(52) U.S. Cl.
  CPC ....... *H01M 50/507* (2021.01); *H01M 50/519* (2021.01); *H01M 50/545* (2021.01)

(58) Field of Classification Search
  CPC ............ H01M 50/507; H01M 50/519; H01M 50/545; H01M 50/503; H01M 50/528; H01M 50/209; H05K 2201/10272; H05K 1/189; H05K 1/18
  See application file for complete search history.

(56) References Cited

U.S. PATENT DOCUMENTS

| | | | |
|---|---|---|---|
| 9,023,499 B2 | 5/2015 | Takase et al. | |
| 9,780,351 B2 | 10/2017 | Shimoda et al. | |
| 10,141,109 B2 | 11/2018 | Nakayama et al. | |
| 2009/0197444 A1 | 8/2009 | De Blieck | |
| 2018/0375227 A1* | 12/2018 | Kaehny | H01R 4/34 |
| 2019/0027731 A1* | 1/2019 | Zeng | H01M 50/543 |
| 2019/0081311 A1* | 3/2019 | Zeng | H01R 12/774 |

FOREIGN PATENT DOCUMENTS

| | | |
|---|---|---|
| CN | 102576845 B | 12/2014 |
| CN | 109103613 A | 12/2018 |
| CN | 109301634 A | 2/2019 |
| CN | 209071559 U | 7/2019 |
| CN | 209104222 U | 7/2019 |
| JP | 2013016381 A | 1/2013 |

* cited by examiner

Primary Examiner — Matthew T Martin
Assistant Examiner — Bartholomew A Hornsby

(57) ABSTRACT

A battery connection module includes a carrying tray, a plurality of busbars and a flexible circuit board. The plurality of busbars are provided on the carrying tray. The flexible circuit board is provided on the carrying tray, the plurality of busbars is adjacent to the flexible circuit board, and the busbar has a notch which is formed to a side toward the flexible circuit board and a notch side plate portion which is positioned alongside the notch, the flexible circuit board has a bending arm which integrally extend out from the flexible circuit board, the bending arm is positioned in the notch of the busbar and a tip of the bending arm is electrically connected to the busbar. In some embodiments, a battery connection module further includes an output connection port provided to the carrying tray. In some embodiments, a battery connection module further includes a connector provided to the carrying tray.

22 Claims, 15 Drawing Sheets

BATTERY CONNECTION MODULE

RELATED APPLICATIONS

The present application claims priority to Chinese Patent Application No. 202010636564.X filed Jul. 3, 2020 which is incorporated by reference in its entirety.

TECHNICAL FIELD

The present disclosure relates to a battery connection module, and particularly relates to a battery connection module which has a busbar and a circuit board.

BACKGROUND

Chinese invention patent application issuance publication No. CN102576845B (corresponding to United States patent issuance No. U.S. Pat. No. 8,777,668B2) discloses a wiring member, the wiring member includes a flexible printed circuit board to be connected to terminals of a plurality of batteries. The flexible printed circuit board has a straight section which is provided along an arrangement of terminals and a plurality of branch sections which are connected to the straight section and extend toward positions of connection to the respective terminals to be connected thereto. The branch section has a deflection portion, the deflection portion can be deformed in response to displacement of the straight section in a longitudinal direction. Cutout portions are alternately formed along the longitudinal direction from a width direction (a-left-right direction), so that the branch section is formed in a S-shape as viewed from an upper side, and thus the S-shaped portion is made to be the deflection portion. However, the branch section is only deformable in response to displacement in the longitudinal direction of the straight section, but cannot respond displacement in a transverse direction perpendicular to the straight section, when the displacement in the transverse direction is generated, it is possible to damage the connection (for example a welded portion) between the branch section and the busbar or damage the wiring member, so such a wiring member still has deficiency in application. Moreover, the busbar and the wiring member need to be spaced apart from each other so as to provide a space for the branch section to extend, which results in additional space occupation.

Chinese invention patent application publication No. CN109103613A (corresponding to United States patent issuance U.S. Pat. No. 10,381,752B2) discloses a module connector, a collar of the module connector is integrally configured to an insulation, and the insulation is assembled on a conductor, when screw locking is performed in mating, a torque force of the screw locking will be applied to the conductor and the collar, because the insulation is supported only by the conductor and the insulation and the conductor affect each other, the insulation is prone to generate rotation and damage. Also, because the insulation employs an upper shell and a lower shell which are assembled together by latching, the insulation is prone to damage under an external force.

SUMMARY

Therefore, an object of the present disclosure is to provide a battery connection module which can improve at least one problem in the prior art.

Accordingly, in some embodiments, a battery connection module of the present disclosure comprises a carrying tray, a plurality of busbars and a flexible circuit board. The plurality of busbars are provided on the carrying tray. The flexible circuit board is provided on the carrying tray, the plurality of busbars is adjacent to the flexible circuit board, and the busbar has a notch which is formed to a side toward the flexible circuit board and a notch side plate portion which is positioned alongside the notch, the flexible circuit board has a bending arm which integrally extend out from the flexible circuit board, the bending arm is positioned in the notch of the busbar and a tip of the bending arm is electrically connected to the busbar.

In some embodiments, the plurality of busbars are arranged along a first direction, and the notch of the busbar is toward the flexible circuit board along a second direction perpendicular to the first direction, the flexible circuit board extend along the first direction, the tip of the bending arm of the flexible circuit board extend along the first direction and is connected to the notch side plate portion of the busbar.

In some embodiments, the busbar has two or more battery connection portions and a buffering portion positioned between every two adjacent battery connection portions, the notch spans the buffering portion.

In some embodiments, the notch is a U-shaped notch structure which is opened toward the flexible circuit board, the notch side plate portion is positioned at each of two sides of the notch in the first direction.

In some embodiments, the battery connection module further comprises a bridging piece which is mechanically and electrically connected between the tip of the bending arm and the notch side plate portion of the busbar and extends along the first direction.

In some embodiments, the plurality of busbars are arranged along a first direction, and a side of the busbar formed with the notch is toward the flexible circuit board in a second direction perpendicular to the first direction, the flexible circuit board along the first direction extend, the bending arm of the flexible circuit board is a U-shaped structure which is opened toward the first direction.

In some embodiments, the plurality of busbars are arranged along a first direction, and a side of the busbar formed with the notch is toward the flexible circuit board in a second direction perpendicular to the first direction, the flexible circuit board extends along the first direction, the bending arm of the flexible circuit board is a U-shaped structure which is opened toward the flexible circuit board in the second direction.

Accordingly, in some embodiments, a battery connection module of the present disclosure comprises a carrying tray, a plurality of busbars, a circuit board and an output connection port. The carrying tray has a busbar mounting portion. The plurality of busbars are provided to the busbar mounting portion of the carrying tray. The circuit board is provided on the carrying tray and electrically connected to the plurality of busbars. The output connection port comprises an output-end seat, an output-end busbar, an output connection piece and an insulative base, the output-end seat is formed integrally from the carrying tray, the output-end busbar has a battery connection portion which is assembled on the busbar mounting portion of the carrying tray and an output connection piece mounting portion which is positioned at the output-end seat, the output connection piece is provided on the output connection piece mounting portion, the insulative base integrally has a rear holding portion, a front holding portion and a mating base which is positioned between the rear holding portion and the front holding portion and receives the output connection piece, the rear holding portion of the insulative base is held between the output-end seat and the busbar mounting portion, the front holding portion of the insulative base is held on the output-end seat.

In some embodiments, two sides of the rear holding portion of the insulative base are formed with two rear holding pieces, two sides of the front holding portion of the insulative base are formed with two front holding pieces, two rear holding grooves are formed between the output-end seat and the busbar mounting portion and cooperate with the two rear holding pieces correspondingly, the output-end seat is formed with two front holding grooves which correspondingly cooperate with the two front holding pieces.

In some embodiments, the front holding piece is formed with an interfering protrusion which interference fits with the front holding groove.

In some embodiments, the output-end seat is formed with a recessed portion which is lower than the carrying tray in height and two side walls which are positioned at two sides of the recessed portion respectively, the front holding portion of the insulative base is lower than the rear holding portion, the insulative base further has two strengthening ribs which corresponding to inner wall surfaces of the two side walls, are connected between the rear holding portion and the front holding portion and are positioned outside the mating base.

In some embodiments, the output connection port further comprises a strengthening fitting which is assembled to one of the side walls of the output-end seat, the strengthening fitting is fixed on an end plate which is assembled with the battery connection module.

In some embodiments, there is a gap between the insulative base and the output-end busbar.

In some embodiments, the output connection piece comprises a conductive ring which is provided on the output connection piece mounting portion of the output-end busbar, a sheathing tube which passes through the conductive ring, and an insulating protective ring which sheathes the sheathing tube and is opened at an upper end thereof.

Accordingly, in some embodiments, a battery connection module of the present disclosure, comprises a carrying tray, a plurality of busbars, a circuit board and a connector. The carrying tray is integrally formed with a connector box at an end thereof. The plurality of busbars are provided on the carrying tray. The circuit board is provided on the carrying tray and electrically connected to the plurality of busbars. The connector is provided on an end of the circuit board and comprises a connector housing which has a connecting hole and a plurality of conductive terminals which are provided to the connector housing and extend into the connecting hole, the connector box comprises a bottom wall, two side walls and an inner side wall, the bottom wall and the two side walls together define an outer side opening, the two side walls and the inner side wall together define an upper opening, an inner side surface of each side wall is integrally formed with an elastic latching piece and a recessed groove which extends downwardly from the upper opening, the connector housing further has protruding bars which correspondingly cooperate with the recessed grooves of the two side walls and latched blocks which correspondingly cooperate with the elastic latching pieces of the two side walls.

In some embodiments, the elastic latching piece is formed so that two ends of the elastic latching piece are connected with the corresponding side wall, the elastic latching piece is integrally inwardly recessed and is thinned in thickness, the connector can enter into the connector box via the upper opening, so that the latched block of the connector housing elastically pushes the elastic latching piece from up to down and then is latched to a lower end of the elastic latching piece of the corresponding side wall.

In some embodiments, the battery connection module further comprises a connector protective cover which can insert into the connecting hole of the connector and make the plurality of conductive terminals to be spaced apart from each other.

In some embodiments, the plurality of conductive terminals are arranged as two rows in an up-down direction in the connecting hole, the connector protective cover has a shielding cover which is used to be provided to the connecting hole of the connector and cover the connecting hole of the connector, a handle which extends outwardly from the shielding cover, a transverse spacing plate which extends inwardly from the shielding cover and transversely and a plurality of spacing bars which are formed to surfaces of the transverse spacing plate in the up-down direction, the transverse spacing plate can make the two rows of the conductive terminals in the up-down direction spaced apart from each other, a plurality of receiving grooves are defined between the plurality of spacing bars and are used to respectively receive the plurality of conductive terminals.

In some embodiments, the connector protective cover further has a fixing hook, the connector housing is formed with a fixing hole which correspondingly cooperates with the fixing hook and is communicated with the connecting hole.

In some embodiments, the connector protective cover further has a plurality of guiding protruding bars which extend from the transverse spacing plate, the connector housing is formed with a plurality of guiding recessed grooves which correspondingly cooperate with the plurality of guiding protruding bars, in a process that the connector protective cover inserts into the connector housing, the plurality of guiding protruding bars are respectively correspondingly received in the plurality of guiding recessed grooves, the guiding protruding bar of the plurality of guiding protruding bars which corresponds to the conductive terminal has a hollow portion positioned inside, the hollow portion accommodates the corresponding conductive terminal.

In some embodiments, the connector protective cover further has a protruding rib which is used to interference fit with an inner wall surface of the connector housing.

In the present disclosure, by that the bending arm of the flexible circuit board extends into the notch of the busbar and is connected to the notch side plate portion, the busbars and the flexible circuit board can be more compact, additionally of space occupation is reduced, and, the bending arm can respond to displacement of the busbar, thereby ensuring the connection relationship between the flexible circuit board and the busbar. In addition, by that the insulative base of the output connection port is assembled to the output-end seat which is integrally formed by the carrying tray and there is the gap between the insulative base and the output-end busbar, it can avoid the insulative base and the output-end busbar directly affecting each other, and the insulative base can be firmly fixed and endurance strength of the mating base of the insulative base is increased. Moreover, by that the connector is assembled in the connector box which is integrally provided to an end of the carrying tray, the connector can be fixed close to the end edge of the carrying tray, which makes the whole battery connection module configured more compactly and makes the connector more conveniently mated with and used. Secondly, by the assembling configuration between the connector box and the connector, the connector is easily and firmly mounted in the connector box of the carrying tray, and fixing and protecting function is provided for the connector and the circuit board (the flexible circuit board).

BRIEF DESCRIPTION OF THE DRAWINGS

Other features and technical effects of the present disclosure will be apparent in an embodiment referring to the accompanying figures, in which.

DETAILED DESCRIPTION OF THE PREFERRED EMBODIMENTS

Figure 1:
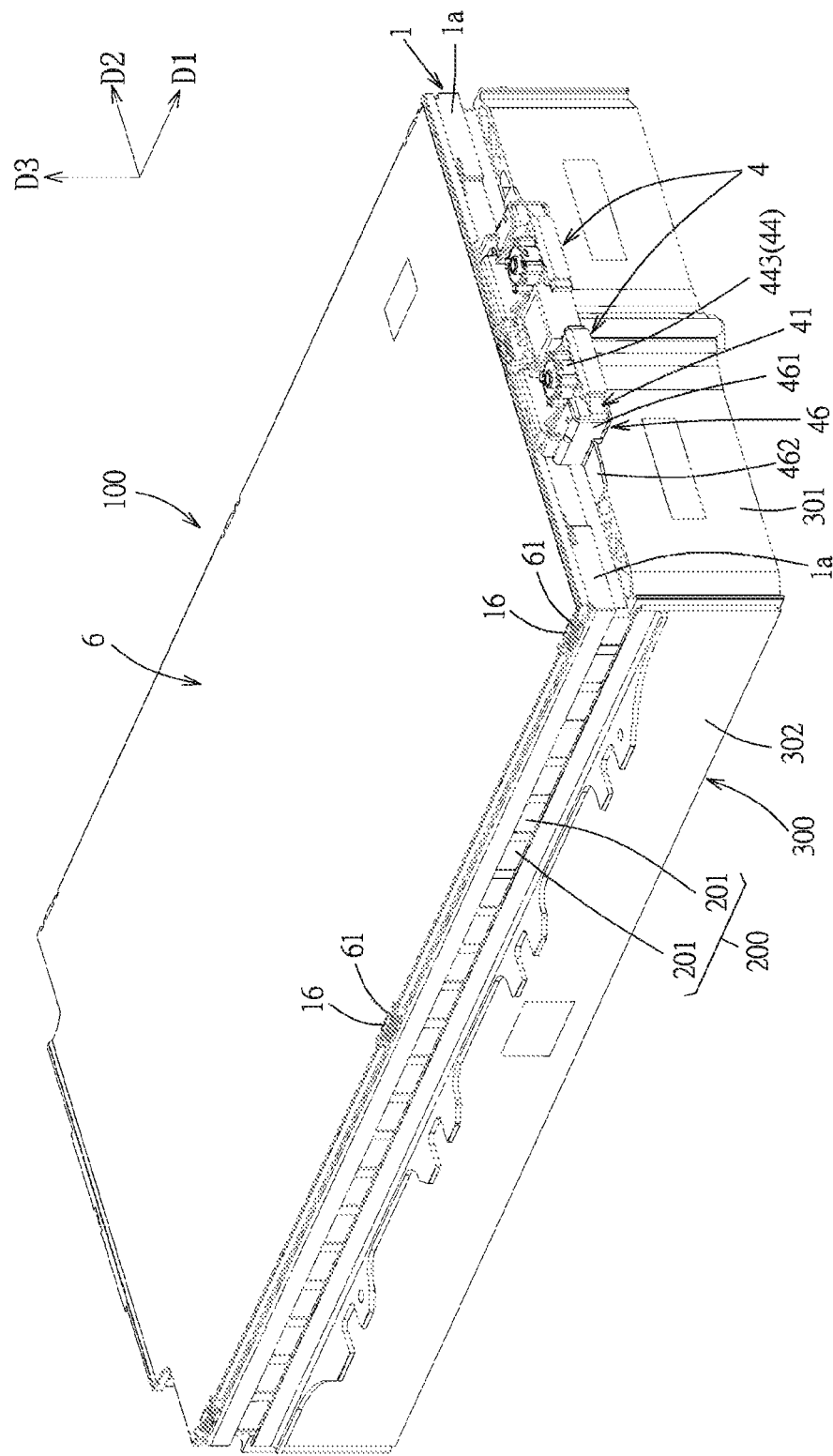
FIG. 1 is a perspective view of a first embodiment of a battery connection module of the present disclosure, a battery set and a battery receiving shell.

Before the present disclosure is described in detail, it should be noted that like elements are denoted by the same reference numerals in the following description.

Figure 2:
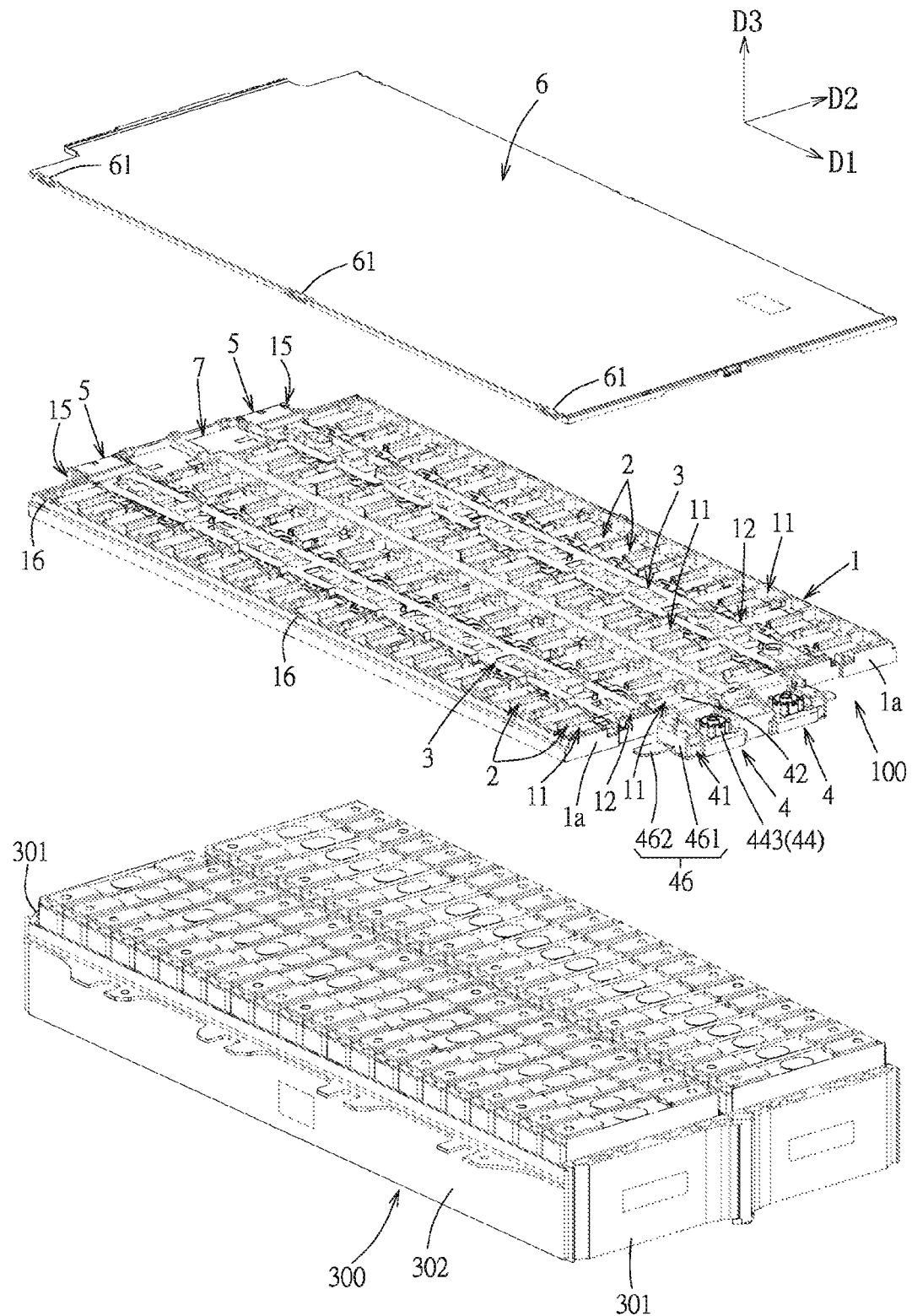
FIG. 2 is a perspective exploded view of FIG. 1.
Figure 3:
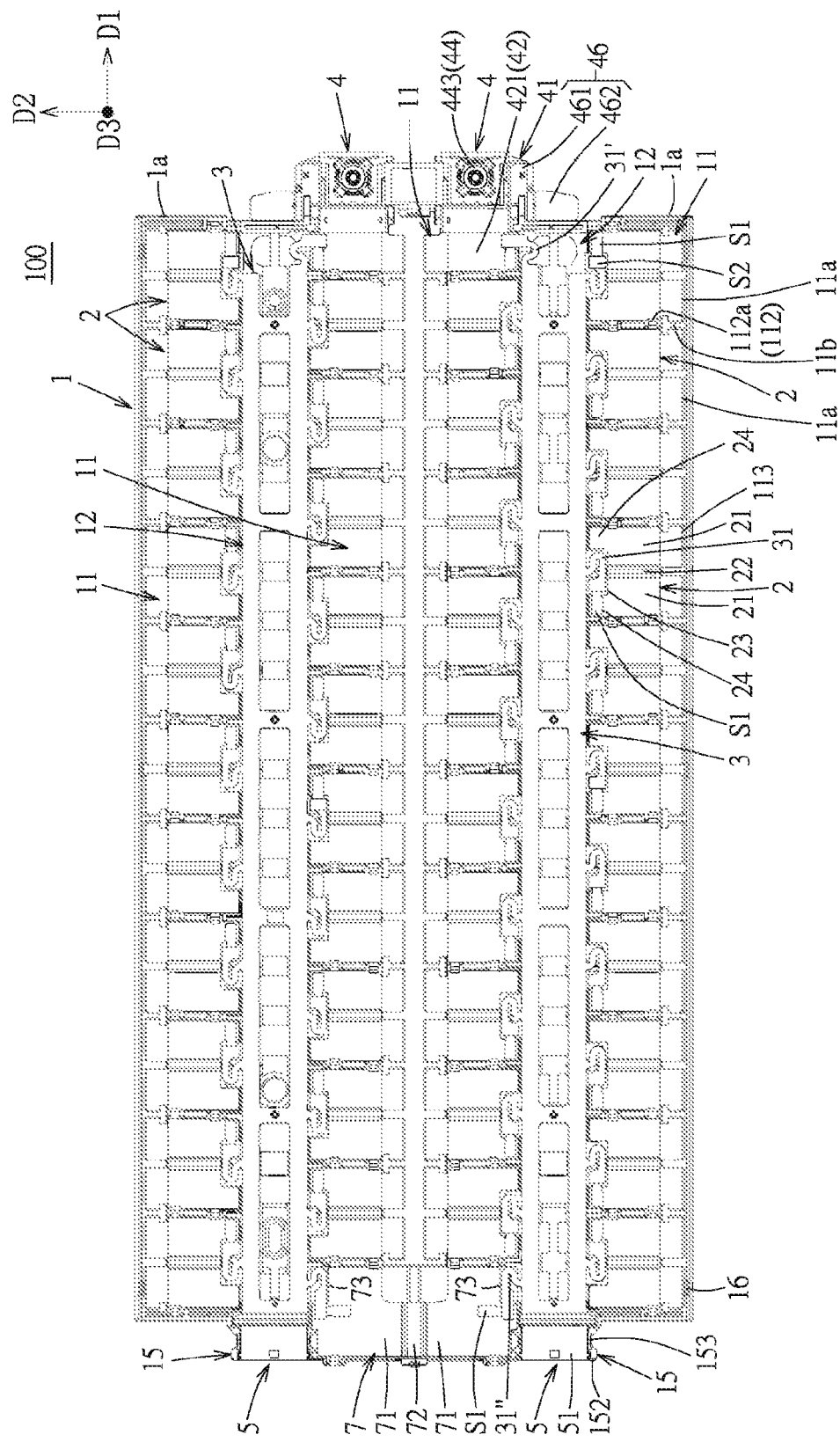
FIG. 3 is a top view of the first embodiment.
Figure 4:
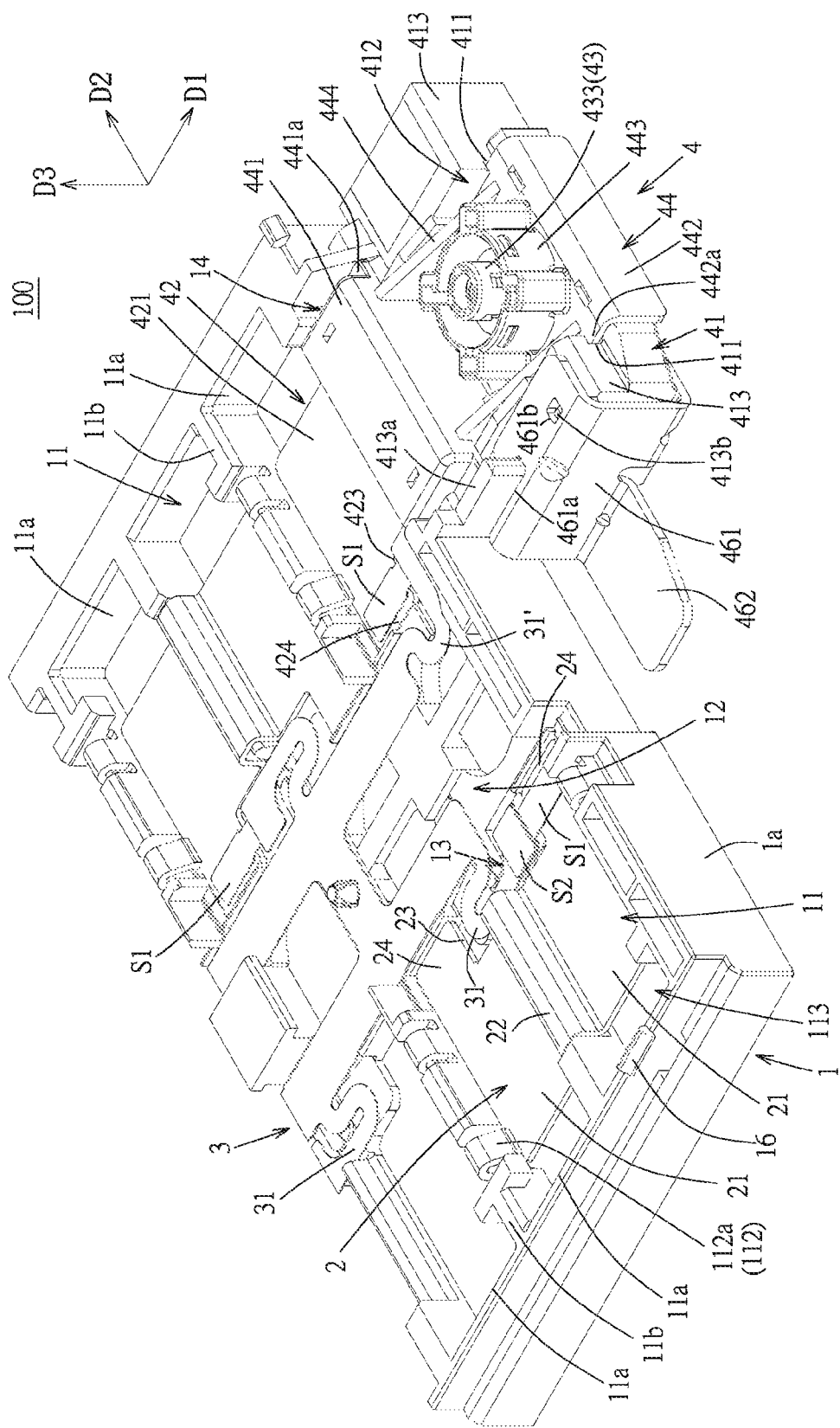
FIG. 4 is a partially enlarged perspective view of the first embodiment.
Figure 5:
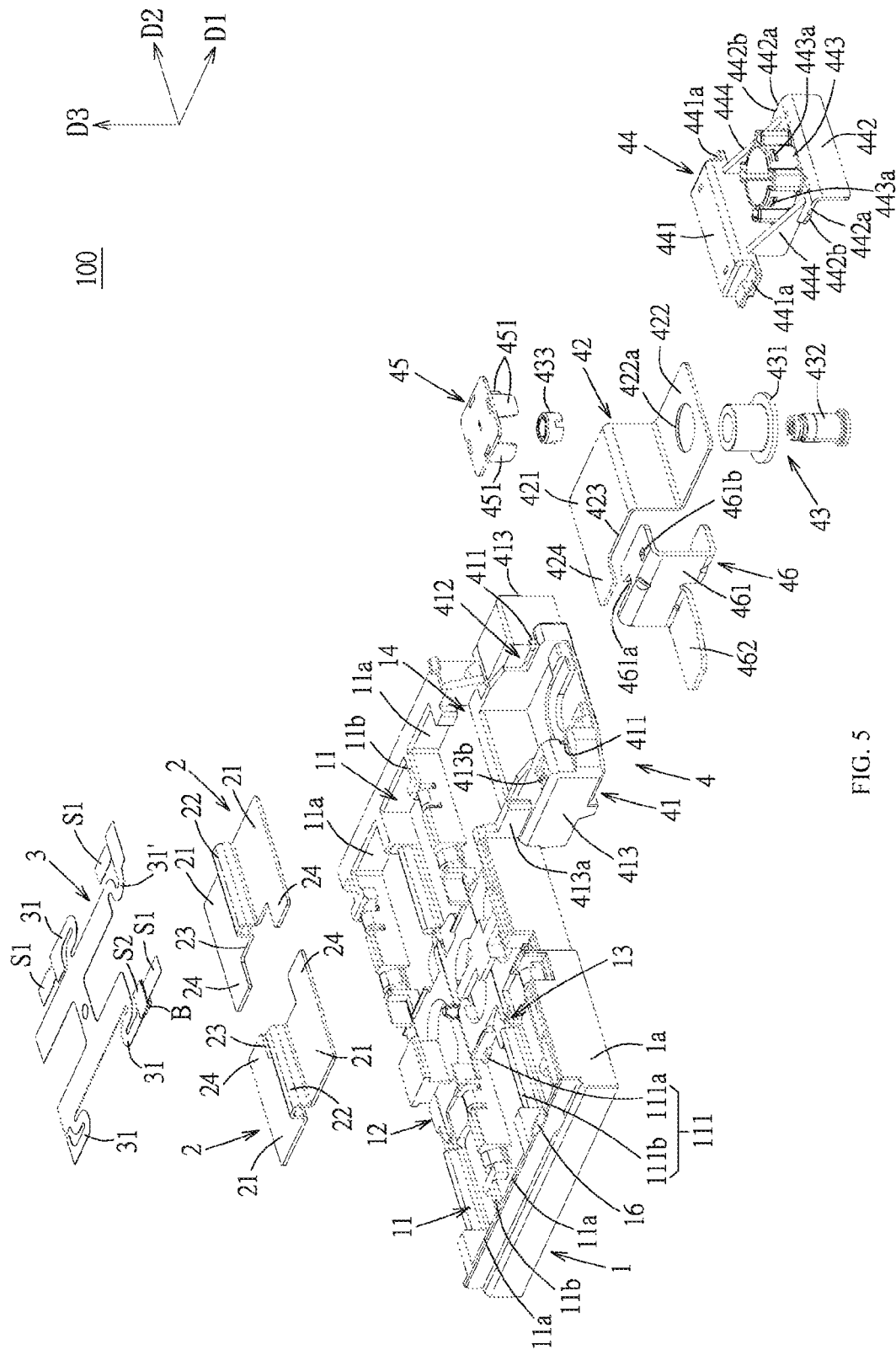
FIG. 5 is a perspective exploded view of FIG. 4.
Figure 6:
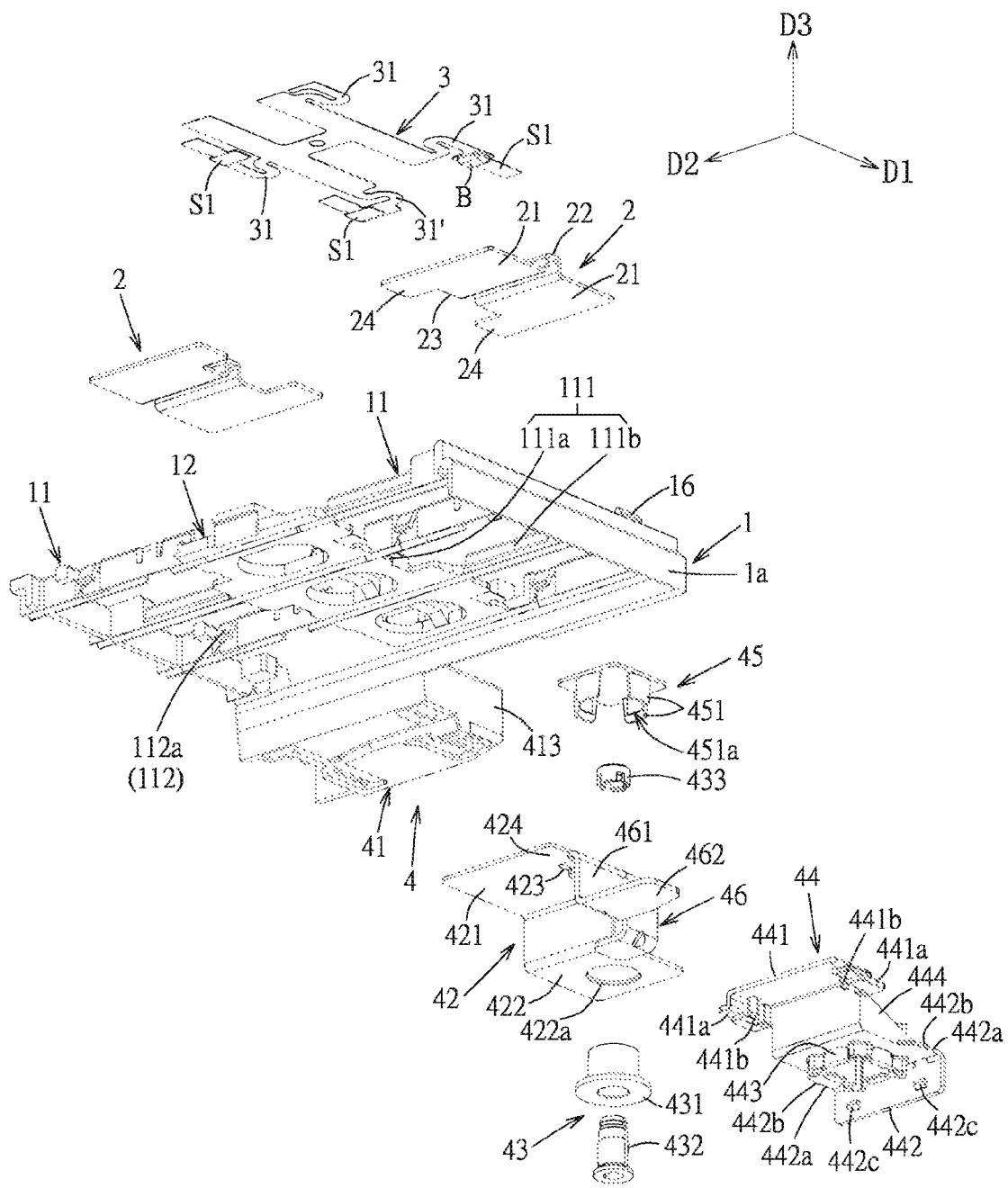
FIG. 6 is a perspective exploded view of the first embodiment in FIG. 5 viewed from another angle.

Referring to FIG. 1 to FIG. 3, a first embodiment of a battery connection module 100 of the present disclosure is adapted to be electrically connected to a battery set 200, the battery set 200 has a plurality of batteries 201, in the first embodiment, the plurality of batteries 201 are arranged as two rows. The battery set 200 is received in a battery receiving shell 300, the battery receiving shell 300 has two end plates 301 positioned at two ends thereof and two side plates 302 positioned at two sides thereof and connected between the two end plates 301. The battery connection module 100 includes a carrying tray 1, a plurality of busbars 2, two flexible circuit boards 3, two output connection ports 4, two connectors 5 and an upper cover 6.

Referring to FIG. 2 to FIG. 6, the carrying tray 1 extends along a front-rear direction D1 (a first direction, in which an arrow pointing direction is front and an opposite direction is rear) and a left-right direction D2 (a second direction, in which an arrow pointing direction is right and an opposite direction is left) and is adapted to be provided on the battery set 200 along an up-down direction D3 (in which an arrow pointing direction is up and an opposite direction is down), and is made of an insulative material. In the first embodiment, the carrying tray 1 has two tray bodies 1a which are integrally connected along the left-right direction D2 side by side and respectively correspond to the two rows of the plurality of batteries 201. It is noted that, the tray body 1a of the carrying tray 1 and the row of the batteries 201 may correspond to each other in number which may be any quantity and is not limited to the first embodiment. Each tray body 1a has two busbar mounting portions 11 which each extend along the front-rear direction D1 and which are spaced apart from each other in the left-right direction D2, arranged side by side in the left-right direction D2 and substantially penetrates in the up-down direction and a circuit board mounting portion 12 which extends along the front-rear direction D1 and is positioned between the two busbar mounting portions 11, each busbar mounting portion 11 has a plurality of busbar mounting grooves 11a which are arranged along the front-rear direction D1. In the first embodiment, the plurality of batteries 201 are connected in series by the plurality of busbars 2, the plurality of busbars 2 are arranged along the front-rear direction D1 and are divided into four rows in the left-right direction D2 so as to respectively correspondingly provided to the busbar mounting grooves 11a of the busbar mounting portions 11 of the two tray bodies 1a. Each busbar 2 has two battery connection portions 21 which are arranged along the front-rear direction D1 and are adapted to be connected with electrodes of the corresponding batteries 201 and a buffering portion 22 which is positioned between the two battery connection portions 21, budges upwardly and extends along the left-right direction D2. The battery connection portion 21 may be connected with the electrode of the corresponding battery 201 for example by welding. In addition, it is noted that, in other varied embodiments, the battery connection portion 21 also may be three or more in number, at this time the buffering portions 22 positioned between two adjacent battery connection portions 21 are two or more in number. The busbar mounting grooves 11a of the busbar mounting portions 11 have a lower limit structure 111 and an upper limit structure 112 which correspondingly limit the plurality of busbars 2 in position, the lower limit structure 111 includes a plurality of lower limit blocks 111a which each are positioned below the battery connection portion 21 of the corresponding busbar 2 and a plurality of lower limit ribs 111b which each positioned below the buffering portion 22 of the corresponding busbar 2. The upper limit structure 112 includes a plurality of upper limit elastic hooks 112a which each positioned above the battery connection portion 21 of the corresponding busbar 2. Specifically, each partitioning wall 11b between two adjacent busbar mounting grooves 11a is configured with two upper limit elastic hooks 112a, the two upper limit elastic hooks 112a extend toward two adjacent busbar mounting grooves 11a respectively. And in the first embodiment, the upper limit elastic hook 112a has an inverted U-shape structure. The lower limit block 111a, the lower limit rib 111b and the upper limit elastic hook 112a together limit the busbar 2, so that the corresponding busbar 2 is movably provided to the busbar mounting portion 11 of the carrying tray 1. When the plurality of busbars 2 are provided to the busbar mounting portions 11 of the carrying tray 1, the busbar mounting portions 11 further have a plurality of windows 113 which each are not covered by the battery connection portion 21 of the corresponding busbar 2 and positioned at a side edge of the battery connection portion 21, the window 113 is used to allow a detecting tool (not shown) to enter therein to detect state of the corresponding battery 201.

The two flexible circuit boards 3 are respectively provided on the circuit board mounting portions 12 of the two tray bodies 1a and respectively corresponds to respective busbars 2 positioned on the two tray bodies 1a. The busbars 2 are adjacent to the flexible circuit board 3, and the busbar 2 further has a notch 23 which is formed a side of the busbar 2 toward the flexible circuit board 3 and spans the buffering portion 22 and two notches side plate portions 24 which are positioned alongside the notch 23. In the first embodiment, the notch 23 is toward the flexible circuit board 3 along the left-right direction D2, and is a U-shaped notch structure which is opened toward the flexible circuit board 3, the two notches side plate portions 24 are positioned at two sides of the notch 23 in the front-rear direction D1 respectively. The flexible circuit boards 3 have a plurality of bending arms 31 which each integrally extend out from the corresponding flexible circuit board 3 and respectively correspond to the plurality of busbars 2, the bending arm 31 is positioned in the notch 23 of the corresponding busbar 2 and a tip of the bending arm 31 is electrically connected to the corresponding busbar 2. Specifically, in the first embodiment, the bending arm 31 of the flexible circuit board 3 is a U-shaped structure which is opened toward the front-rear direction D1, the tip of the bending arm 31 of the flexible circuit board 3 extends in the front-rear direction D1 and is connected to the notch side plate portion 24 of the corresponding busbar 2, and, the battery connection module 100 further includes a plurality of bridging pieces S1 which each are mechanically and electrically connected between the tip of the corresponding bending arm 31 and the notch side plate portion 24 of the corresponding busbar 2 and which each extend along the front-rear direction D1, the bridging piece S1 is a conductive metal material, for example, the bridging piece S1 may be provided to the tip of the corresponding bending arm 31 and the notch side plate portion 24 of the corresponding busbar 2 by welding or binding with a conductive adhesive. It is noted that, in the first embodiment, a connection location between the tip of the bending arm 31 and the bridging piece S1 (or an opposite surface of the connection location) may be further covered with a supporting piece S2 which is used to strengthen the strength of the connection location, and/or a packaging block B which is used to bind the bending arm 31 and the bridging piece S1 and is used to package an electronic component (not shown, for example, a temperature sensing element) positioned at the connection location, the packaging block B may be an adhesive, a thermal conductive glue, an antioxidant protective glue or a combination thereof, a material thereof may be for example silica gel, epoxy resin and the like. By that the bending arm 31 of the flexible circuit board 3 extends into the notch 23 of the busbar 2 and is connected to the notch side plate portion 24, the busbars 2 and the flexible circuit board 3 can be more compact, additionally of space occupation is reduced, and, the bending arm 31 can respond to displacement of the busbar 2, thereby ensuring the connection relationship between the flexible circuit board 3 and the busbar 2. Also, in the first embodiment, because the bending arm 31 is the U-shaped structure which is opened toward the front-rear direction D1, the bending arm 31 can more highly respond to displacement of the busbar 2.

In addition, in the first embodiment, the carrying tray 1 is further formed with a depressed portion 13 which is positioned between the busbar mounting portion 11 and the circuit board mounting portion 12 and corresponds to the tip of the bending arm 31. Specifically, the depressed portion 13 is positioned between the lower limit rib 111b and the circuit board mounting portion 12, the depressed portion 13 provides the bending arm 31 with a displacement space positioned below the bending arm 31.

Figure 7:
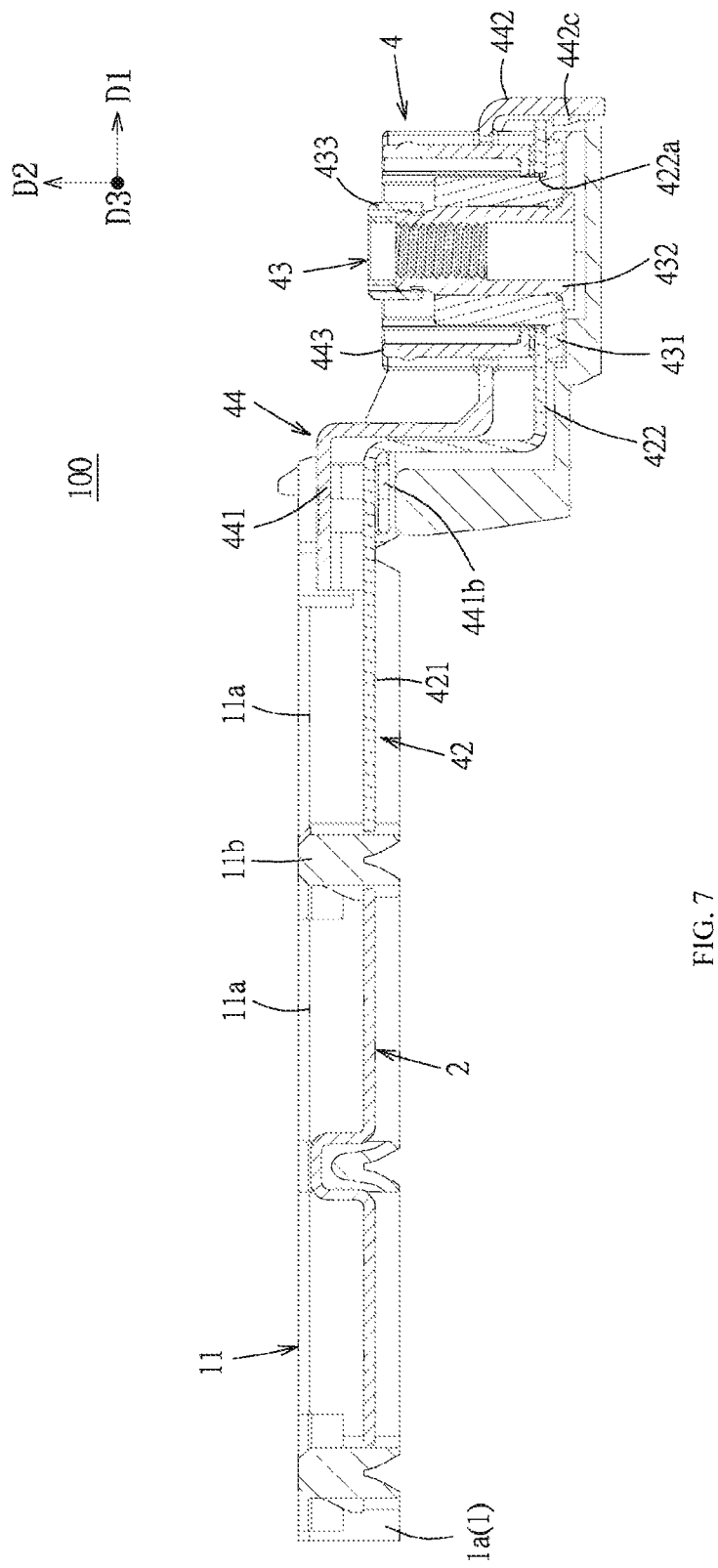
FIG. 7 is a cross sectional view of the first embodiment illustrating an output connection port of the first embodiment.
Figure 8:
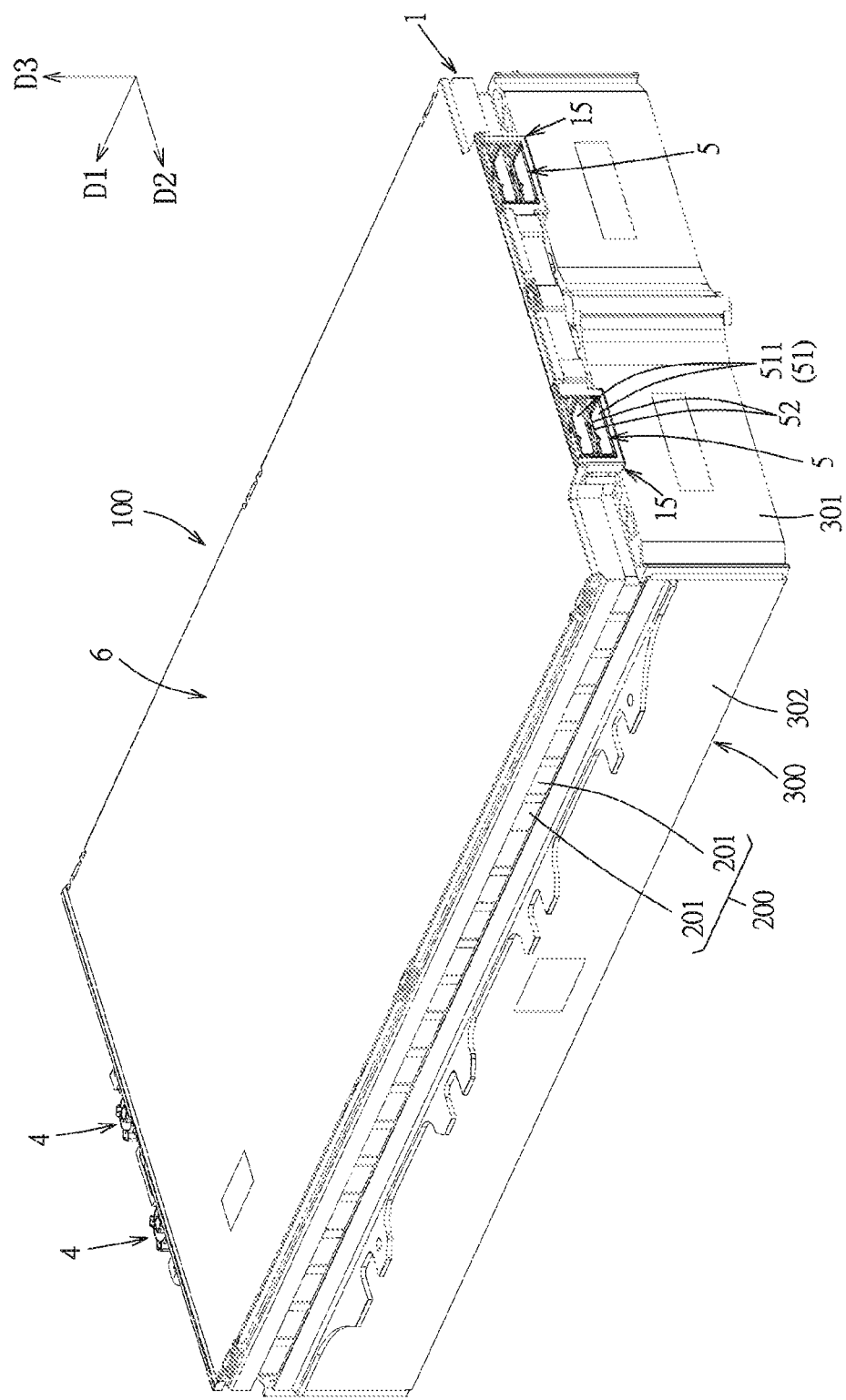
FIG. 8 is a perspective view of the first embodiment, the battery set and the battery receiving shell in FIG. 1 viewed from another angle.

Referring to FIG. 2 and FIG. 4 to FIG. 7, the two output connection ports 4 are used to mate with power connection bars (not shown) to output a power. Each output connection port 4 includes an output-end seat 41, an output-end busbar 42, an output connection piece 43 and an insulative base 44. The output-end seats 41 of the two output connection ports 4 each are integrally formed from an end of each of the two tray bodies 1a of the carrying tray 1 in the front-rear direction D1, the output-end busbar 42 has a battery connection portion 421 which is assembled on the corresponding busbar mounting groove 11a of the busbar mounting portion 11 of the carrying tray 1 and an output connection piece mounting portion 422 which is positioned on the output-end seat 41. The output connection piece 43 is provided on the output connection piece mounting portion 422. In the first embodiment, the output connection piece mounting portion 422 is formed with a penetrating hole 422a, the output connection piece 43 includes a conductive ring 431 which passes through the penetrating hole 422a of the output connection piece mounting portion 422 of the output-end busbar 42, a sheathing tube 432 which passes through the conductive ring 431 and is formed with a thread inside to allow the power connection bar (not shown) to be locked and an insulating protective ring 433 which sheathes the sheathing tube 432 and is opened at an upper end thereof. In other embodiments, the conductive ring 431 also may be directly integrally formed to the output connection piece mounting portion 422 of the output-end busbar 42. The insulative base 44 integrally has a rear holding portion 441, a front holding portion 442 and a mating base 443 which is positioned between the rear holding portion 441 and the front holding portion 442 and receives the output connection piece 43, the rear holding portion 441 of the insulative base 44 is held between the output-end seat 41 and the busbar mounting portion 11, the front holding portion 442 of the insulative base 44 is held on the output-end seat 41. Two sides of the rear holding portion 441 in the left-right direction are formed with two rear holding pieces 441a, two sides of the front holding portion 442 in the left-right direction are formed with two front holding pieces 442a, each tray body 1a of the carrying tray 1 is formed with two rear holding grooves 14 which are positioned between the output-end seat 41 and the busbar mounting portion 11 and cooperate with the two rear holding pieces 441a correspondingly, the output-end seat 41 is formed with two front holding grooves 411 which cooperate with the two front holding pieces 442a correspondingly. The front holding piece 442a is formed with interfering protrusion 442b which interference fits with an inner wall surface of the front holding groove 411 so that the insulative base 44 is fixedly provided to the output-end seat 41 of the carrying tray 1. In addition, in the first embodiment, the rear holding portion 441 further has two latch hooks 441b which are positioned below the battery connection portion 421 of the output-end busbar 42; in the first embodiment, the front holding portion 442 further has two latching blocks 442c which are positioned below a front edge of the output connection piece mounting portion 422 of the output-end busbar 42. Furthermore, as shown in FIG. 7, in the first embodiment, there is a gap between the insulative base 44 and the output-end busbar 42, that is to say, the insulative base 44 and the output-end busbar 42 does not directly contact therebetween. By that the insulative base 44 of the output connection port 4 is assembled to the output-end seat 41 which is integrally formed by the carrying tray 1 and there is the gap between the insulative base 44 and the output-end busbar 42, it can avoid the insulative base 44 and the output-end busbar 42 directly affecting each other, and the insulative base 44 can be firmly fixed and endurance strength of the mating base 443 of the insulative base 44 is increased, and the insulative base 44 will not be rotated.

It is noted that, the output-end busbar 42 further has a notch 423 which is formed to a side of the battery connection portion 421 toward the flexible circuit board 3 and a notch side plate portion 424 which positioned alongside the notch 423. The flexible circuit board 3 further has a bending arm 31' which integrally extends out from the flexible circuit board 3 and corresponds to the output-end busbar 42, the bending arm 31' is positioned in the notch 423 of the output-end busbar 42 and a tip of the bending arm 31' is electrically connected to the output-end busbar 42. Specifically, in the first embodiment, the bending arm 31' of the flexible circuit board 3 is a U-shaped structure which is opened toward the output-end busbar 42, the tip of the bending arm 31' of the flexible circuit board 3 extends in the left-right direction D2 and is connected to the notch side plate portion 424 of the output-end busbar 42, moreover, the tip of the bending arm 31 and the notch side plate portion of the output-end busbar 42 are also mechanically and electrically connected by a bridging piece S1.

Referring to FIG. 3, the battery connection module 100 further includes a spanning busbar 7 which is provided to the other end of the carrying tray 1 away from the two output connection ports 4 in the front-rear direction D1 and spans the two tray bodies 1a, the spanning busbar 7 is provided to the busbar mounting grooves 11a of the busbar mounting portions 11 and is used to connect the two rows of the plurality of batteries 201 in series, so that the two output connection ports 4 are positioned at two tips of the whole connected in series structure of the battery set 200 respectively so as to act as end points of the power output. The spanning busbar 7 has two battery connection portions 71 which are arranged along the left-right direction D2 and are adapted to be connected with the corresponding electrodes of the batteries 201, a buffering portion 72 which is positioned between the two battery connection portions 71, budges upwardly and extends along the front-rear direction D1 and two notches 73 which are respectively formed at two corners, the corners are respectively toward the two flexible circuit boards 3. Each flexible circuit board 3 further has a bending arm 31" which integrally extends out from the flexible circuit board 3 and corresponds to the spanning busbar 7, the bending arm 31" is a U-shaped structure which is opened toward the same direction as the bending arm 31, a tip of the bending arm 31" is mechanically and electrically connected to the battery connection portion 71 of the spanning busbar 7 via a bridging piece S1 which extends along the left-right direction D2.

Referring to FIG. 1 and FIG. 4 to FIG. 7, in the first embodiment, the output-end seat 41 is formed with a recessed portion 412 which is lower than the carrying tray 1 in height and two side walls 413 which are respectively positioned at two sides of the recessed portion 412 in the left-right direction, the front holding portion 442 of the insulative base 44 is lower than the rear holding portion 441, the insulative base 44 further has two strengthening ribs 444 which correspond to inner wall surfaces of the two side walls 413, are connected between the rear holding portion 441 and the front holding portion 442 and positioned outside the mating base 443. With the two strengthening ribs 444, the structure strength of the insulative base 44 is strengthened, and the endurance strength of the mating base 443 of the insulative base 44 is further increased.

Furthermore, each output connection port 4 further includes a protective cover 45 which is used to be provided to the mating base 443 and cover the mating base 443 and a strengthening fitting 46 which is assembled to the output-end seat 41. The mating base 443 is formed with a plurality of latching blocks 443a at an outer side of the mating base 443, the protective cover 45 has a plurality of latched portions 451 which extend downwardly and latch to the outer side of the mating base 443, an inner side surface of each latched portion 451 is formed with a latched groove 451a which latches with the corresponding latching block 443a, so that the protective cover 45 can be provided on the mating base 443 and cover the mating base 443. The strengthening fitting 46 is assembled to an outer side of one of the side walls 413 of the output-end seat 41 and is adapted to be fixed on the corresponding end plate 301 which is assembled with the battery connection module 100. The strengthening fitting 46 has a main body 461 which has a C-shaped cross section to surround the corresponding side wall 413 from three sides and be assembled to the corresponding side wall 413 and a fixing piece 462 which extends out from the main body 461 along the left-right direction D2 and is fixed on the corresponding end plate 301 for example by welding and the like. The side wall 413 is formed with a snapping rib 413a which is formed upwardly and an elastic latching block 413b which is upwardly formed, the main body 461 is formed with a snapping notch 461a which is snapped to the snapping rib 413a and a latching hole 461b which latches with the elastic latching block 413b correspondingly. The strengthening fitting 46 can make the output-end seat 41 better supported, in turn the endurance strength of the mating base 443 of the insulative base 44 assembled to the output-end seat 41 is further increased.

Referring to FIG. 8 to FIG. 11, the other end of each tray body 1a of the carrying tray 1 opposite to the output-end seat 41 in the front-rear direction D1 is integrally formed with a connector box 15. The two connectors 5 are respectively mechanically and electrically provided ends of the two flexible circuit boards 3 respectively adjacent to the connector boexes boxes 15. Each connector 5 includes a connector housing 51 which has a connecting hole 511 and a plurality of conductive terminals 52 which are provided to the connector housing 51 and extend into the connecting hole 511. In the first embodiment, the connector housing 51 has two the connecting holes 511 which are arranged along the up-down direction D3, and the plurality of conductive terminals 52 are distributed in the two connecting holes 511, however, the connecting hole 511 may be adjusted in number as desired, so the present disclosure should be not limited thereto. The connector box 15 includes a bottom wall 151, two side walls 152 which extend upwardly from two side edges of the bottom wall 151 in the left-right direction D2 respectively and an inner side wall 153 which is connected to the bottom wall 151 and the two side walls 152 and is connected to the tray body 1a of the carrying tray 1, the bottom wall 151 and the two side walls 152 together define an outer side opening 154, the two side walls 152 and the inner side wall 153 together define an upper opening 155, an inner side surface of each side wall 152 is formed with a recessed groove 152a which is integrally configured and extends downwardly from the upper opening 155 and an elastic latching piece 152b which is positioned at an inner side relative to the recessed groove 152a, the connector housing 51 further has a plurality of protruding bars 512 which correspondingly cooperate with the recessed grooves 152a of the two side walls 152 and two latched block 513 which correspondingly cooperate with the elastic latching pieces 152b of the two side walls 152. In the first embodiment, the side wall 152 of the connector housing 51 is provided with the two protruding bars 512 which are respectively positioned at the upper and the lower, however the two protruding bars 512 also may be changed as one elongated protruding bar. In the first embodiment, the elastic latching piece 152b is formed so that two ends of the elastic latching piece 152b are connected with the corresponding side wall 152, the elastic latching piece 152b is integrally inwardly recessed and is thinned in thickness, the elastic latching piece 152b extends along the front-rear direction D1, and each side wall 152 further formed with a latching groove 152c which penetrates the side wall 152 below the elastic latching piece 152b and allows the corresponding latched block 513 to latch therewith. When the connector 5 enters into the connector box 15 via the upper opening 155, first the protruding bars 512 at the two sides of the connector housing 51 respectively enter into the recessed grooves 152a of the two side walls 152 from up to down to guide the connector housing 51 to insert into, then the latched block 513 of the connector housing 51 elastically pushes the elastic latching piece 152b to outwardly elastically displace, after the latched block 513 passes over the elastic latching piece 152b, the elastic latching piece 152b restores and the latched block 513 is latched to a lower end of the elastic latching piece 152b of the side wall 152 and enters into the latching groove 152c of the side wall 152, so that the connector 5 is mounted in the connector box 15 of the carrying tray 1. The protruding bars 512 and the recessed grooves 152a form a cooperating first holding structure, and the latched block 513 and the elastic latching piece 152b form a cooperating second holding structure. It is noted that, in other embodiments, the two side walls 152 also may be not formed with a latching groove 152c which has a penetrating shape, in addition, the recessed groove 152a, the elastic latching piece 152b, the protruding bar 512 and the latched block 513 may be adjusted in number as desired, which is not limited to the first embodiment in number. By that the connector 5 is assembled in the connector box 15 which is integrally provided to an end of the carrying tray 1, the connector 5 can be fixed close to the end edge of the carrying tray 1, which makes the whole battery connection module 100 configured more compactly and makes the connector 5 more conveniently mated with and used. Secondly, by the assembling configuration between the connector box 15 and the connector 5, the connector 5 is easily and firmly mounted in the connector box 15 of the carrying tray 1, and fixing and protecting function is provided for the connector 5 and the circuit board (the flexible circuit board 3).

It is noted that, state information (for example temperature, voltage and the like) of the two rows of the plurality of batteries 201 of the battery set 200 can be collected by the two flexible circuit boards 3, and the state information can be transmitted to a battery management system (not shown) mated with the two connectors 5 via the two connectors 5 provided on the two flexible circuit boards 3.

Referring to FIG. 9 to FIG. 14, in the first embodiment, the battery connection module 100 further includes four connector protective covers 8 which can insert into the connecting holes 511 of the two connectors 5 of and make the plurality of conductive terminals 52 to be spaced apart from each other, the plurality of connector protective cover 8 can prevent particles such as dust and the like from entering into the connecting holes 511 of the two connectors 5, and can make the plurality of conductive terminals 52 to be spaced apart from each other so as to further prevent possible short circuit. The plurality of conductive terminals 52 are arranged so that two rows of conductive terminal 52 is arranged in each corresponding connecting hole 511 in the up-down direction, each connector protective cover 8 has a shielding cover 81 which is used to cover the corresponding connecting hole 511 of the connector 5, a handle 82 which extends outwardly from the shielding cover 81 along the front-rear direction D1, a transverse spacing plate 83 which extends inwardly from the shielding cover 81 along the front-rear direction D1 and transversely along the left-right direction D2 and a plurality of spacing bars 84 which are formed to surfaces of the transverse spacing plate 83 in the up-down direction and extend along the front-rear direction D1, the transverse spacing plate 83 can i makes the two rows of the conductive terminals 52 in the up-down direction spaced apart from each other, receiving grooves 85 are define between the plurality of spacing bars 84 and are used to respectively receive the conductive terminals 52.

In fixing configuration aspect, each connector protective cover 8 further has a fixing hook 86 which is formed upwardly from the transverse spacing plate 83, a plurality of guiding protruding bars 87 which protrude from the surfaces of the transverse spacing plate 83, extend from the transverse spacing plate 83 along the front-rear direction D1 and staggered with each other in the left-right direction D2, and a plurality of protruding ribs 88 which is used to interference fit with an inner wall surface of the connector housing 51. The connector housing 51 is formed with a fixing hole 514 which correspondingly cooperates with the fixing hook 86 and is communicated with the corresponding connecting hole 511 and a plurality of guiding recessed grooves 515 which correspondingly cooperate with the plurality of guiding protruding bars 87. In a process that the connector protective cover 8 inserts into the connector housing 51, the plurality of guiding protruding bars 87 are respectively correspondingly received in the plurality of guiding recessed grooves 515, by that the plurality of guiding protruding bars 87 and the plurality of guiding recessed grooves 515 cooperate with each other, foolproof function can be realized when the connector protective cover 8 inserts into the connecting hole 511 of the connector housing 51, and the process that the connector protective cover 8 inserts into the connecting hole 511 of the connector housing 51 is more smoothly and is not prone to skew. After the connector protective cover 8 completely inserts into the connecting hole 511 of the connector housing 51, the fixing hook 86 latches into the fixing hole 514, and the plurality of protruding ribs 88 and the inner wall surface of the connector housing 51 interference fit with each other, so that the connector protective cover 8 is stably provided to the connecting hole 511 of the connector housing 51 and covers the connecting hole 511 of the connector housing 51. In the first embodiment, the plurality of protruding ribs 88 are formed to two sides of the transverse spacing plate 83 in the left-right direction, but the present disclosure is not limited thereto. In addition, it is noted that, the guiding protruding bar 87 of the plurality of guiding protruding bars 87 which corresponds to the conductive terminal 52 has a hollow portion 871 positioned inside, the hollow portion 871 accommodates the corresponding conductive terminal 52, also, such guiding protruding bar 87 and the spacing bars 84 cooperate with each other and together define the receiving grooves 85, so as to further generate a function that the conductive terminals 52 are spaced apart from each other.

In addition, the connector 5 further has two back plates 53 which are provided to an end of the connector housing 51 opposite to the connecting hole 511 and together clamp the flexible circuit board 3, the plurality of conductive terminals 52 pass through the two back plates 53 and the flexible circuit board 3 which is clamped between the two back plates 53, so as to be mechanically and electrically connected to circuit traces on the flexible circuit board 3, and a part of each of the plurality of conductive terminals 52 which extends out of the back plates 53 is provided with a packaging body 54, the packaging body 54 may be a package adhesive of an epoxy material or other package material. Moreover, the connector box 15 further formed with a recessed channel 156 which is positioned at a boundary between the bottom wall 151 and the inner side wall 153 and receives the two back plates 53.

Figure 9:
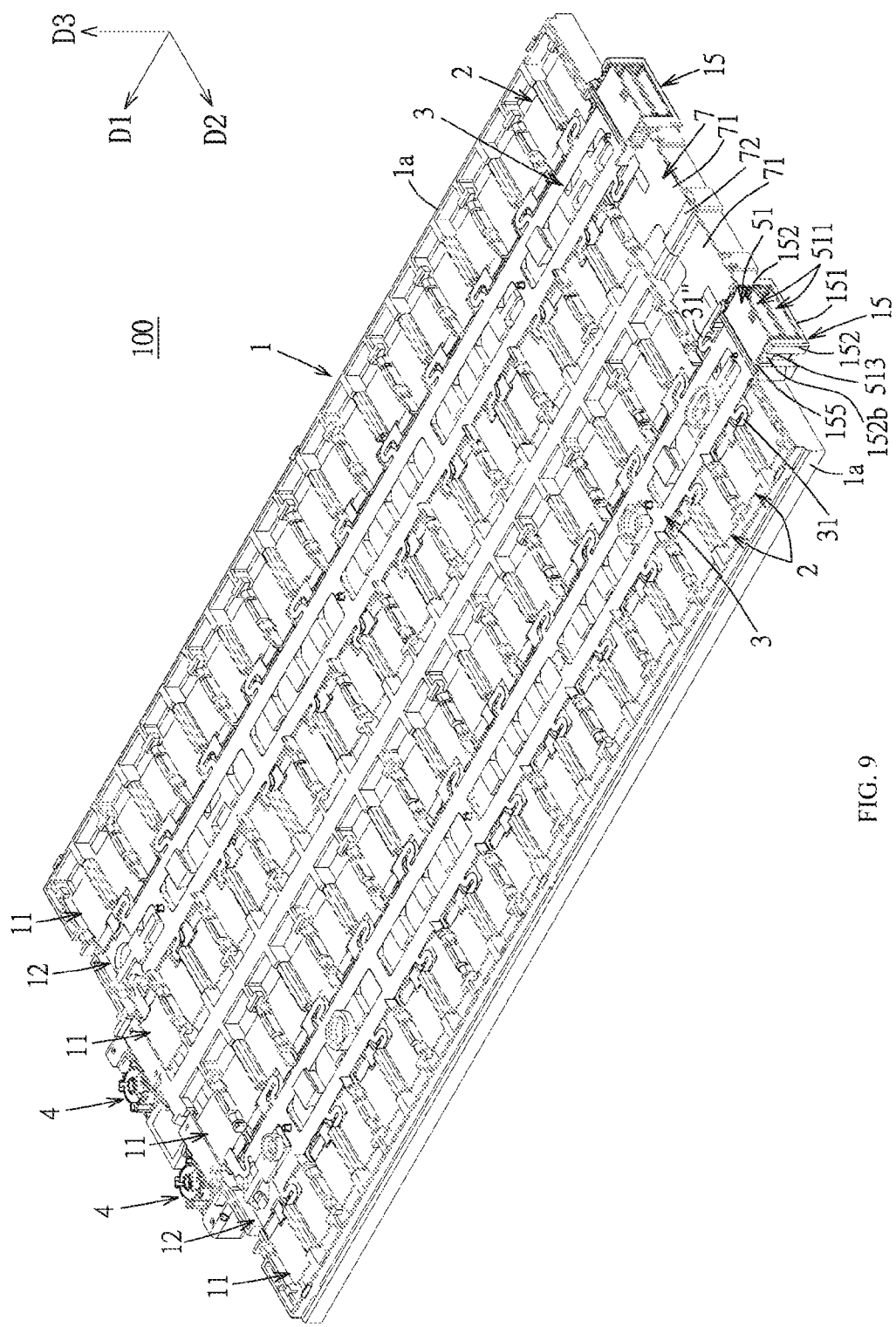
FIG. 9 is a perspective view of the first embodiment.
Figure 10:
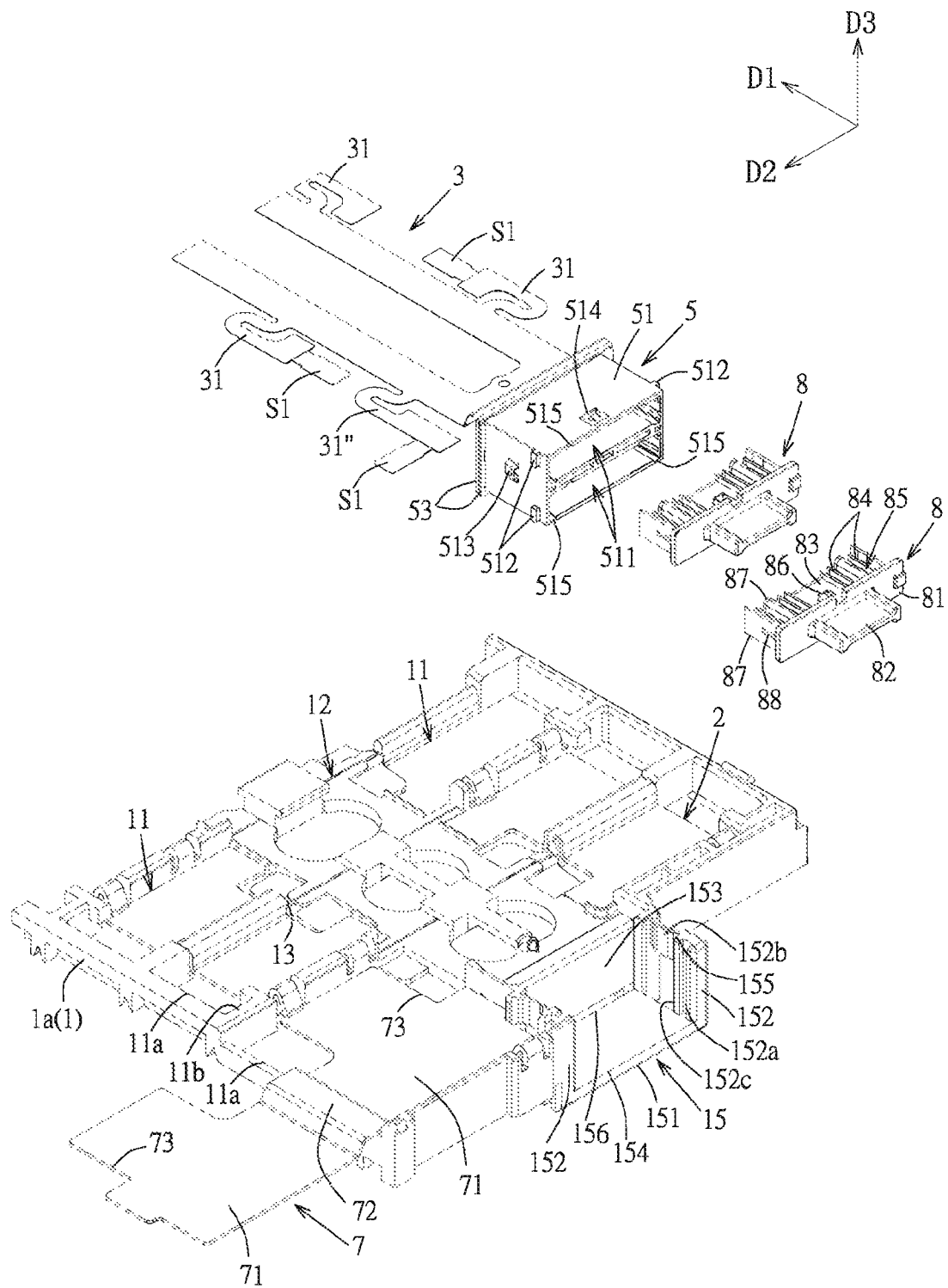
FIG. 10 is a partially enlarged perspective view of the first embodiment illustrating a connector of the first embodiment.
Figure 11:
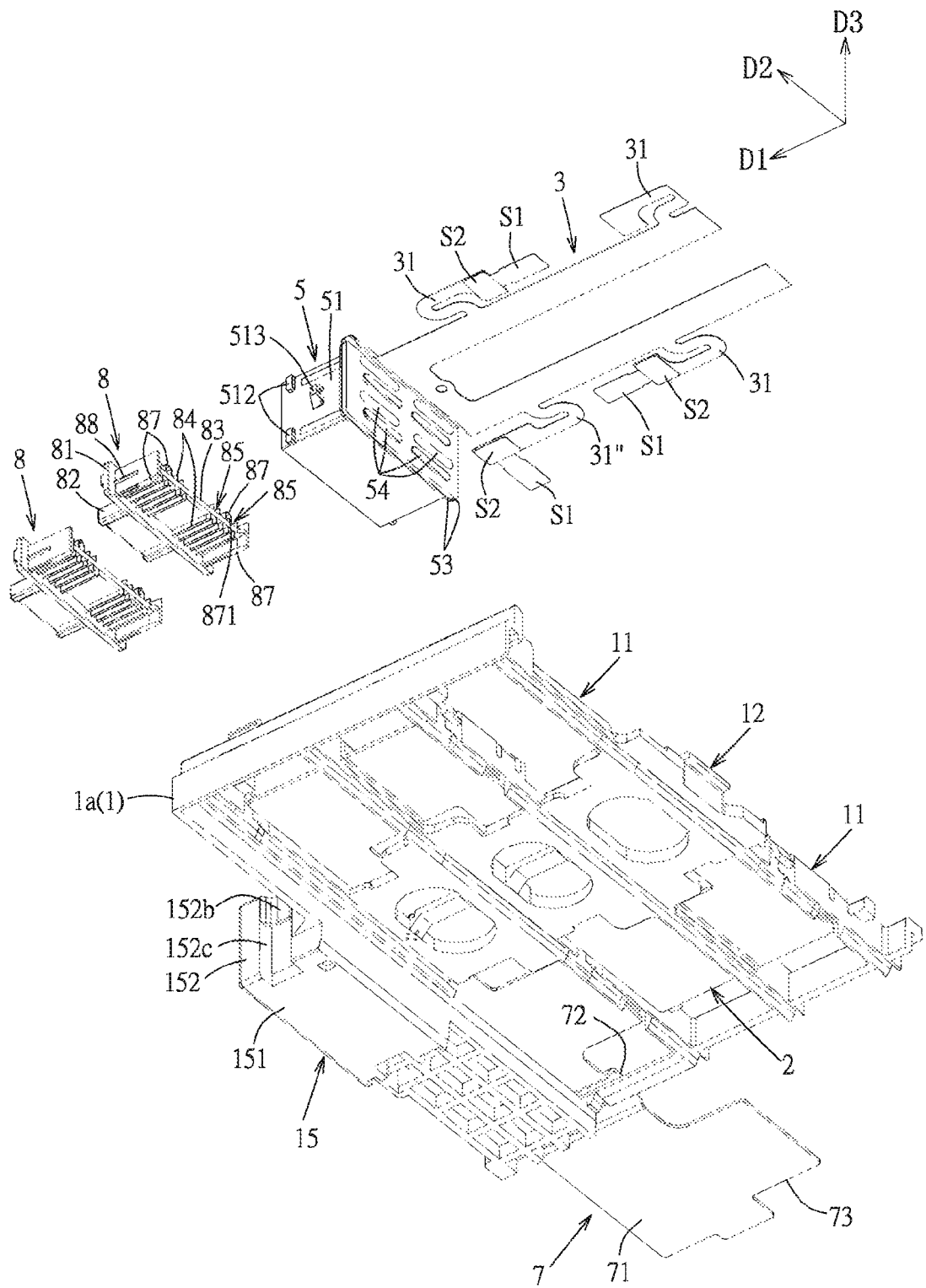
FIG. 11 is a partially enlarged perspective view of the first embodiment in FIG. 10 viewed from another angle.
Figure 12:
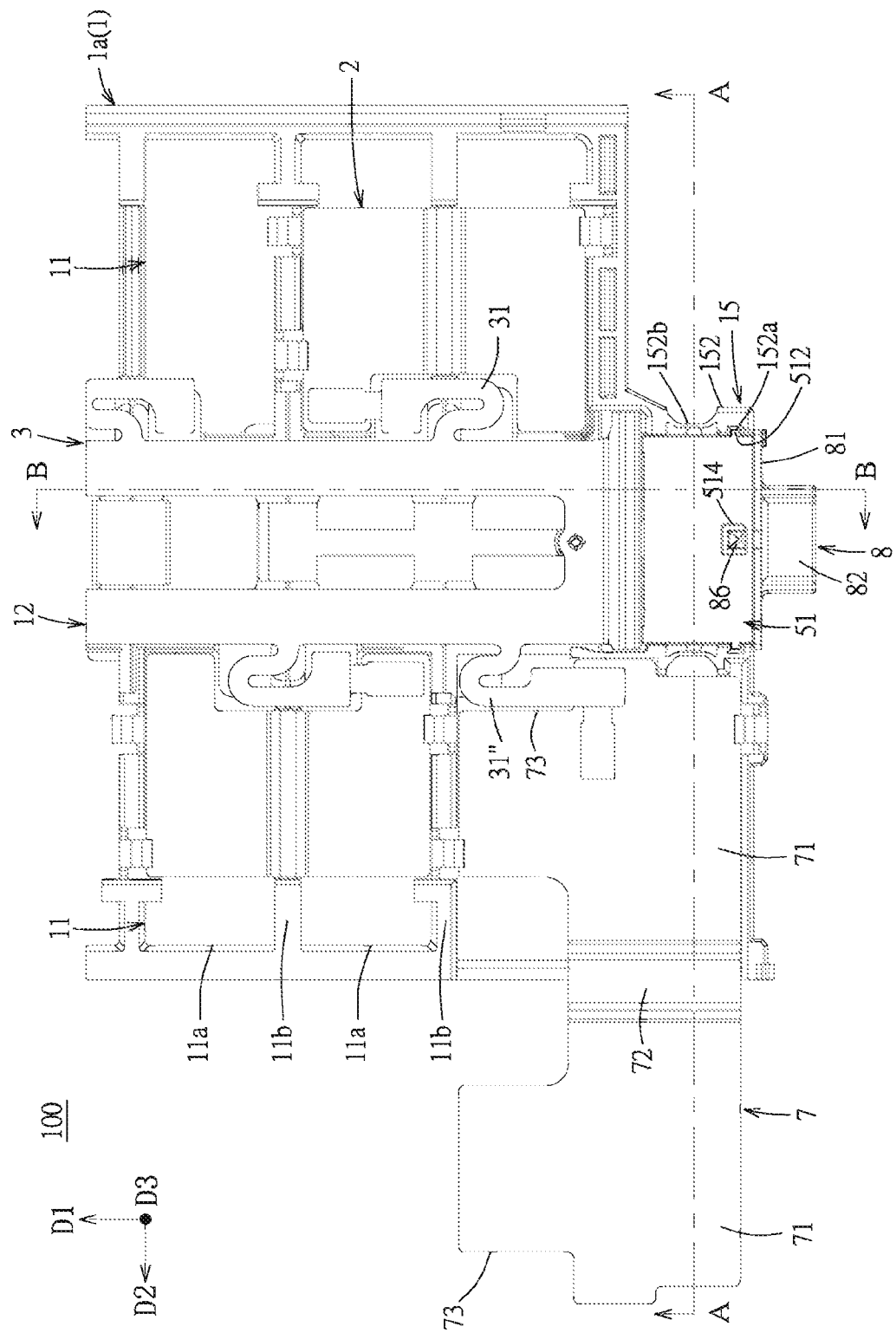
FIG. 12 is a partial top view of the first embodiment illustrating the connector of the first embodiment.
Figure 13:
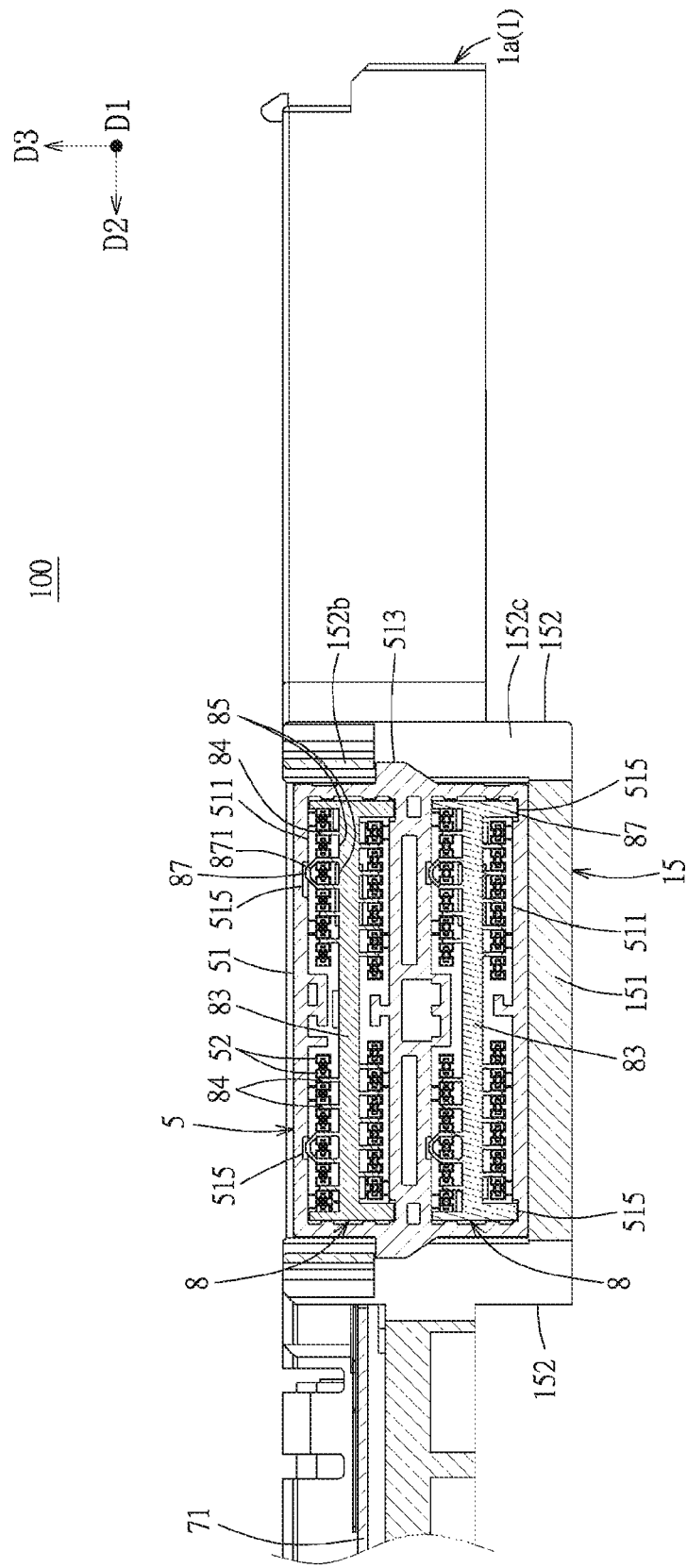
FIG. 13 is a partial cross sectional view taken along a line A-A of FIG. 12.
Figure 14:
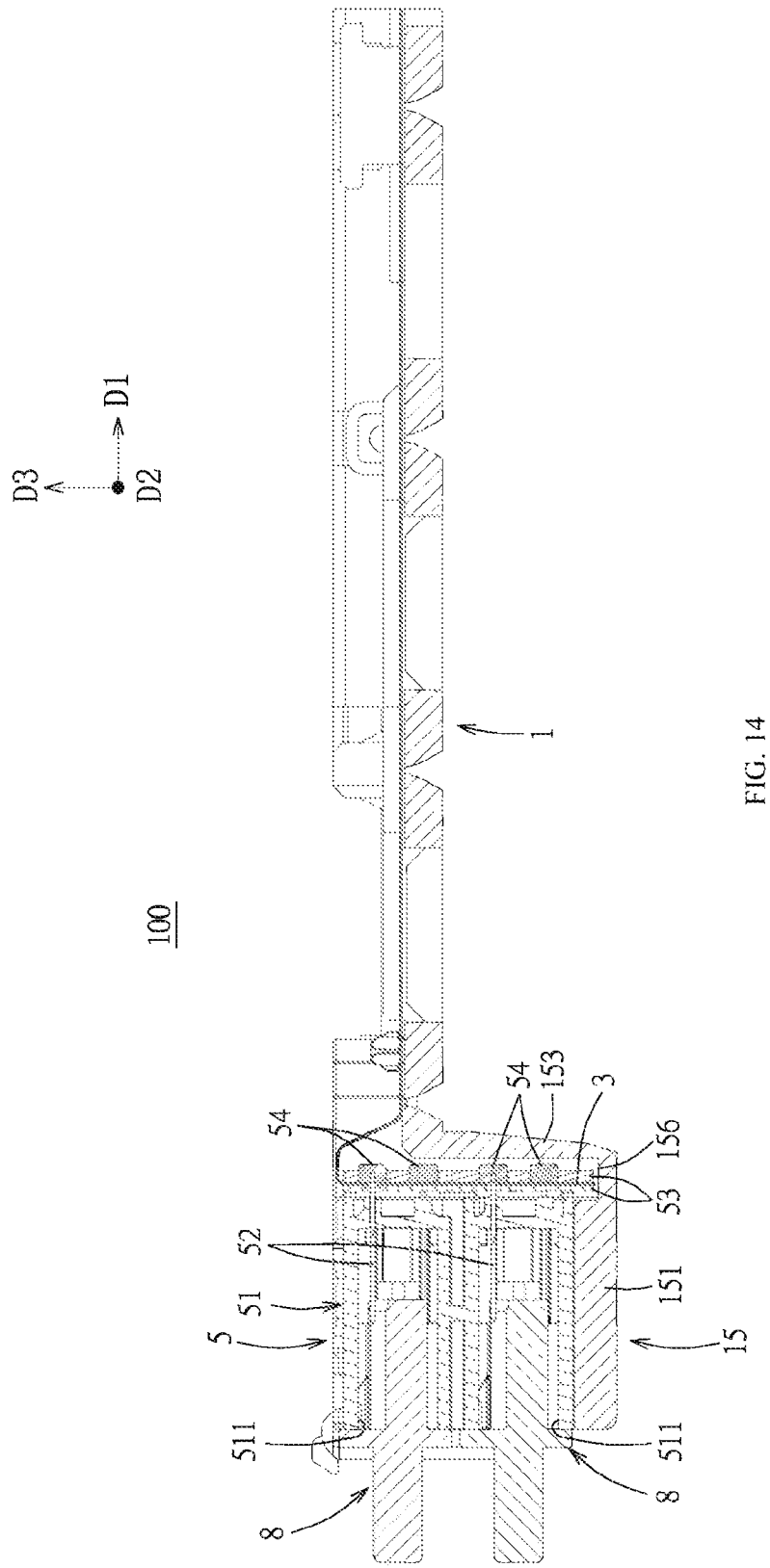
FIG. 14 is a partially cross sectional view taken along a line B-B of FIG. 12.

Referring to FIG. 2 and FIG. 9, it is noted that, in a varied embodiment, the plurality of batteries 201 also may be arranged only as one row, at this time the flexible circuit board 3 and the connector 5 each are correspondingly adjusted as one in number, in other embodiments, when the plurality of batteries 201 also may be arranged as three or more rows, the flexible circuit board 3 and the connector 5 each also may be correspondingly adjusted as three or more in number, the present disclosure is not limited to the first embodiment.

Referring to FIG. 1 to FIG. 2, the upper cover 6 is provided to the carrying tray 1 and coves the carrying tray 1 and covers the plurality of busbars 2, the two flexible circuit boards 3 and the upper openings 155 of the two connector boxes 15. A plurality of latching blocks 16 are formed at an edge of the carrying tray 1, a plurality of latching holes 61 are formed at an edge of the upper cover 6 and correspondingly latch with the plurality of latching blocks 16, so that the upper cover 6 is fixedly provided to the carrying tray 1 and cover the carrying tray 1.

Figure 15:
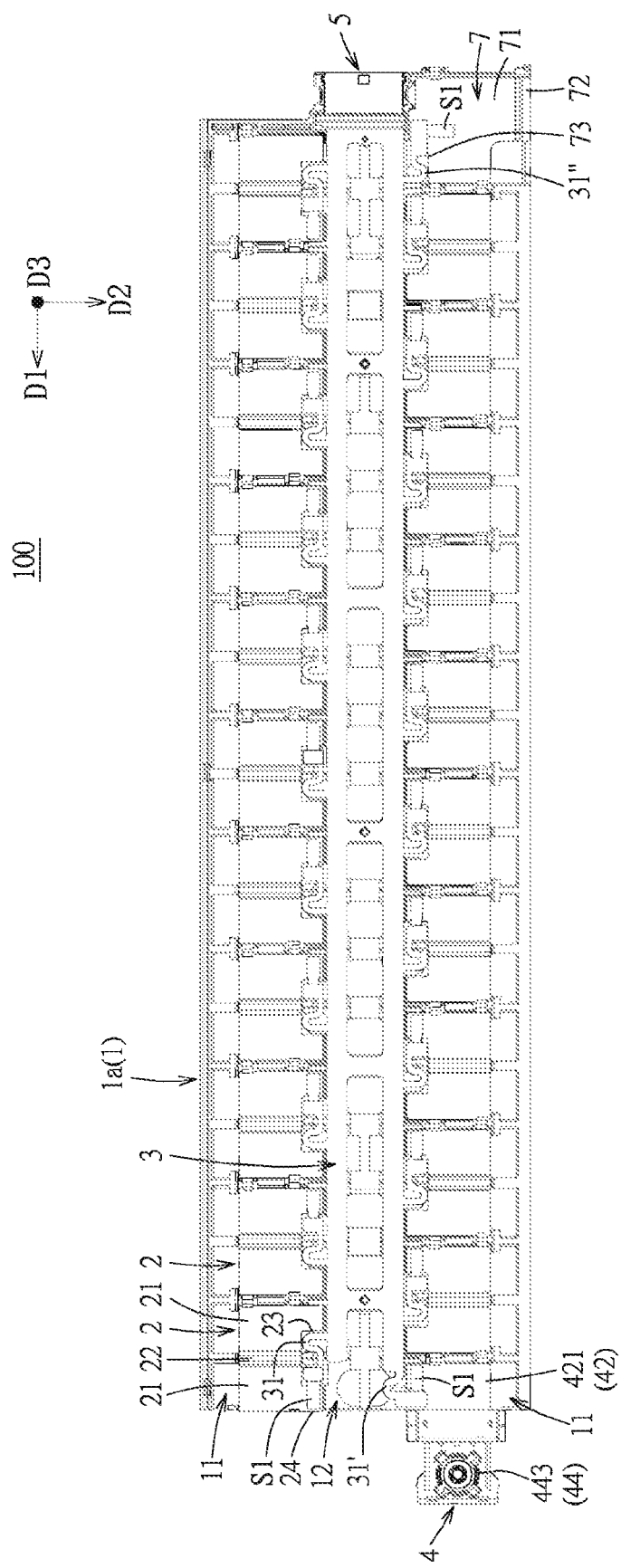
FIG. 15 is the present disclosure battery connection module of a second embodiment of a top view.

Referring to FIG. 15, a second embodiment of the battery connection module 100 of the present disclosure differs from the first embodiment in that, the bending arm 31 of the flexible circuit board 3 is a U-shaped structure which is opened in the left-right direction D2 toward the flexible circuit board 3. It is noted that, in other embodiments, the bending arm 31 also may be not a U-shaped structure but may be other bending structure, for example may combine the U-shaped structure of the first embodiment and the U-shaped structure of the second embodiment which are opened toward different directions to form a wave-like bending structure, therefore, a practical structure of the bending arm 31 should be limited by the above embodiments.

In conclusion, in the present disclosure by that the bending arm 31 of the flexible circuit board 3 extends into the notch 23 of the busbar 2 and is connected to the notch side plate portion 24, the busbars 2 and the flexible circuit board 3 can be more compact, additionally of space occupation is reduced, and, the bending arm 31 can respond to displacement of the busbar 2, thereby ensuring the connection relationship between the flexible circuit board 3 and the busbar 2. By that the insulative base 44 of the output connection port 4 is assembled to the output-end seat 41 which is integrally formed by the carrying tray 1 and there is the gap between the insulative base 44 and the output-end busbar 42, it can avoid the insulative base 44 and the output-end busbar 42 directly affecting each other, and the insulative base 44 can be firmly fixed and endurance strength of the mating base 443 of the insulative base 44 is increased. Moreover, by that the connector 5 is assembled in the connector box 15 which is integrally provided to an end of the carrying tray 1, the connector 5 can be fixed close to the end edge of the carrying tray 1, which makes the whole battery connection module 100 configured more compactly and makes the connector 5 more conveniently mated with and used. Secondly, by the assembling configuration between the connector box 15 and the connector 5, the connector 5 is easily and firmly mounted in the connector box 15 of the carrying tray 1, and fixing and protecting function is provided for the connector 5 and the circuit board (the flexible circuit board 3).

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. A battery connection module, comprising:
   an insulative carrying tray;
   a plurality of conductive busbars extending along a first direction and provided on the carrying tray; and
   a flexible circuit board extending along the first direction and provided on the carrying tray, the plurality of busbars being adjacent to the flexible circuit board and being adjacent to each other, and each busbar having a notch which is open to a side of the flexible circuit board and a notch side plate portion which is positioned alongside the notch and defines an end of the notch, the flexible circuit board having a plurality of bending arms, each of which integrally extends outward from the flexible circuit board, wherein respective bending arms are positioned in the notch of the respective busbar and a tip of the respective bending arm which extends along the first direction is electrically connected to the notch side plate portion of the respective busbar.

2. The battery connection module of claim 1, wherein the tip of the respective bending arm of the flexible circuit board extends along the first direction.

3. The battery connection module of claim 2, wherein each busbar has two or more battery connection portions and a buffering portion positioned therebetween, the notch spanning the buffering portion.

4. The battery connection module of claim 3, wherein the notch side plate portion is a first notch side plate portion and defines a first end of the notch of each busbar, and wherein each busbar further includes a second notch side plate portion which defines a second end of the respective notch in the first direction.

5. The battery connection module of claim 4, wherein the tip of each bending arm is electrically connected to the notch side plate portion of the respective busbar by a bridging piece which mechanically and electrically connects the tip of the respective bending arm to the respective notch side plate portion, each bridging piece extending along the first direction.

6. The battery connection module of claim 1, wherein each bending arm of the flexible circuit board is a U-shaped structure which is opened toward the first direction.

7. The battery connection module of claim 1, wherein each bending arm of the flexible circuit board is a U-shaped structure which is opened toward the flexible circuit board in a second direction which is perpendicular to the first direction.

8. A battery connection module, comprising:
   an insulative carrying tray defining a busbar mounting portion;
   a plurality of conductive busbars provided on the busbar mounting portion of the carrying tray;

a circuit board provided on the carrying tray and electrically connected to the plurality of busbars; and an output connection port comprising an insulative output-end seat, a conductive output-end busbar, an output connection piece and an insulative base, the insulative output-end seat being formed integrally with the insulative carrying tray, the output-end busbar having a battery connection portion which is assembled on the busbar mounting portion of the carrying tray and an output connection piece mounting portion which is positioned at the output-end seat, the battery connection portion being electrically connected to the circuit board, the output connection piece being provided on the output connection piece mounting portion and electrically connected thereto, the insulative base integrally having a rear holding portion, a front holding portion and a mating base which is positioned between the rear holding portion and the front holding portion and receives the output connection piece, the rear holding portion of the insulative base being held between the output-end seat and the busbar mounting portion, and the front holding portion of the insulative base being held on the output-end seat.

9. The battery connection module of claim 8, wherein
two sides of the rear holding portion of the insulative base are formed with two rear holding pieces, two sides of the front holding portion of the insulative base are formed with two front holding pieces, and two rear holding grooves are formed between the output-end seat and the busbar mounting portion and cooperate with the two rear holding pieces correspondingly, the output-end seat is formed with two front holding grooves which correspondingly cooperate with the two front holding pieces.

10. The battery connection module of claim 9, wherein the front holding piece is formed with an interfering protrusion which interference fits with the front holding groove.

11. The battery connection module of claim 9, wherein
the output-end seat is formed with a recessed portion which is lower than the carrying tray in height and two side walls which are positioned at two sides of the recessed portion respectively, the front holding portion of the insulative base is lower than the rear holding portion, and the insulative base further comprises two strengthening ribs which correspond to inner wall surfaces of the two side walls, are connected between the rear holding portion and the front holding portion, and are positioned outside the mating base.

12. The battery connection module of claim 11, wherein
the output connection port further comprises a strengthening fitting which is assembled to one of the side walls of the output-end seat, and the strengthening fitting is fixed on an end plate which is assembled with the battery connection module.

13. The battery connection module of claim 8, wherein there is a gap between the insulative base and the output-end busbar.

14. The battery connection module of claim 8, wherein the output connection piece comprises a conductive ring which is provided on the output connection piece mounting portion of the output-end busbar, a sheathing tube which passes through the conductive ring, and an insulating protective ring which sheathes the sheathing tube and is opened at an upper end thereof.

15. A battery connection module, comprising:
an insulative carrying tray integrally formed with a connector box at an end thereof, the connector box comprising a bottom wall extending along a first direction, two side walls extending along the first direction, and an inner side wall extending along a second direction, the bottom wall and the two side walls together defining an outer side opening, the two side walls and the inner side wall together defining an upper opening;

a plurality of conductive busbars provided on the carrying tray;

a circuit board provided on the carrying tray and extending along the first direction, the circuit board being electrically connected to the plurality of busbars; and a connector mechanically and electrically coupled to an end of the circuit board and including a connector housing comprising walls forming a connecting hole and a plurality of conductive terminals extending into the connecting hole, wherein the connector seats within the connector box through the upper opening;

a first holding structure provided between the connector housing and the two upstanding side walls of the connector box, wherein during insertion of the connector housing into the connector box the first holding structure allows for movement of the connector housing relative to the connector box along a down direction through the upper opening while preventing movement of the connector housing relative to the connector box along the first direction toward the outer side opening; and a second holding structure provided between the connector housing and the walls of the connector box, the second holding structure preventing movement of the connector housing relative to the connector box along an up direction through the upper opening when engaged.

16. The battery connection module of claim 15, wherein the first holding structure is protruding bars which extend from the walls of the connector housing and correspondingly cooperate with the recessed grooves of the two side walls of the connector box, and the second holding structure is latched blocks which extend from the walls of the connector housing and correspondingly cooperate with elastic latching pieces of the two side walls of the connector box.

17. The battery connection module of claim 16, wherein
each elastic latching piece is formed so that two ends of the elastic latching piece are connected with the corresponding side wall of the connector box, wherein each elastic latching piece is integrally inwardly recessed and is thinned in thickness, wherein the connector is configured to enter into the connector box through the upper opening, so that the latched blocks of the connector housing elastically push the elastic latching pieces from up to down and then are latched to a lower end of the elastic latching pieces of the corresponding side wall of the connector box.

18. The battery connection module of claim 17, wherein the battery connection module further comprises a connector protective cover is configured to be inserted into the connecting hole of the connector to space the plurality of conductive terminals apart from each other.

19. The battery connection module of claim 18, wherein
the plurality of conductive terminals are arranged as two rows in an up-down direction in the connecting hole, the connector protective cover including a shielding cover which covers the connecting hole of the connector, a handle extending outwardly from the shielding cover, a transverse spacing plate extending inwardly from the shielding cover and transversely, and a plurality of spacing bars provided on surfaces of the transverse spacing plate in the up-down direction, wherein the transverse spacing plate is configured to space the two rows of the conductive terminals in the up-down direction apart from each other, and wherein a plurality of receiving grooves are defined between the plurality of spacing bars and respectively receive the plurality of conductive terminals.

20. The battery connection module of claim 19, wherein the connector protective cover further including a fixing hook, and the connector housing including a fixing hole which correspondingly cooperates with the fixing hook and is communicated with the connecting hole.

21. The battery connection module of claim 20, wherein the connector protective cover further has a plurality of guiding protruding bars which extend from the transverse spacing plate, the connector housing is formed with a plurality of guiding recessed grooves which correspondingly cooperate with the plurality of guiding protruding bars, and wherein in a process that the connector protective cover inserts into the connector housing, the plurality of guiding protruding bars are respectively correspondingly received in the plurality of guiding recessed grooves, and wherein a guiding protruding bar of the plurality of guiding protruding bars which corresponds to the conductive terminal has a hollow portion positioned inside, the hollow portion accommodates the corresponding conductive terminal.

22. The battery connection module of claim 20, wherein the connector protective cover further has a protruding rib which is used to interference fit with an inner wall surface of the connector housing.

* * * * *